(12) United States Patent
Okagawa et al.

(10) Patent No.: US 10,811,976 B2
(45) Date of Patent: Oct. 20, 2020

(54) ELECTRONIC CIRCUIT DEVICE

(71) Applicant: Sumitomo Electric Industries, Ltd., Osaka-shi (JP)

(72) Inventors: Yusuke Okagawa, Osaka (JP); Masayoshi Hirota, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/615,608

(22) PCT Filed: May 21, 2018

(86) PCT No.: PCT/JP2018/019433
§ 371 (c)(1),
(2) Date: Nov. 21, 2019

(87) PCT Pub. No.: WO2018/235484
PCT Pub. Date: Dec. 27, 2018

(65) Prior Publication Data
US 2020/0195147 A1 Jun. 18, 2020

(30) Foreign Application Priority Data
Jun. 21, 2017 (JP) .................................. 2017-121608

(51) Int. Cl.
*H02M 7/00* (2006.01)
*H01L 25/16* (2006.01)
(Continued)

(52) U.S. Cl.
CPC ........... *H02M 3/1588* (2013.01); *H02M 1/44* (2013.01); *H01L 25/162* (2013.01); *H01L 27/00* (2013.01); *H02M 7/003* (2013.01)

(58) Field of Classification Search
CPC ....... H01L 27/00; H01L 25/162; H02M 7/003
(Continued)

(56) References Cited

U.S. PATENT DOCUMENTS 9,153,563 B2 * 10/2015 Muto ................ H01L 23/49562
9,343,288 B2 * 5/2016 Koyama ................. H01L 21/00
(Continued)

FOREIGN PATENT DOCUMENTS

| JP | 2003-164040 A | 6/2003 |
| JP | 2013-099057 A | 5/2013 |

(Continued)

*Primary Examiner* — Gary A Nash
(74) *Attorney, Agent, or Firm* — Baker Botts L.L.P.; Michael A. Sartori

(57) ABSTRACT

The electronic circuit device is provided with: a power conversion circuit having a switching element incorporated therein; and a circuit substrate on which a circuit element constituting the power conversion circuit is mounted and a wiring pattern configured to electrically connect circuit elements is disposed. The power conversion circuit is composed of a pair of switching elements configured to supply energy to a choke coil intermittently in phase. The circuit substrate is constituted of a double-sided substrate in which one switching element is mounted on one main surface while the other switching element is mounted on the other main surface and a wiring pattern is provided in a manner such that a current path including one switching element and a current path including the other switching element overlap each other in plan view and have opposite current directions.

4 Claims, 8 Drawing Sheets

(51) Int. Cl.
*H01L 27/00* (2006.01)
*H02M 3/158* (2006.01)
*H02M 1/44* (2007.01)

(58) Field of Classification Search
USPC .................... 257/E27.001; 323/282; 363/147
See application file for complete search history.

(56) References Cited

U.S. PATENT DOCUMENTS

| | | | |
|---|---|---|---|
| 2007/0196950 A1* | 8/2007 | Shirai | H01L 24/40 |
| | | | 438/106 |
| 2010/0127683 A1* | 5/2010 | Uno | H01L 24/06 |
| | | | 323/282 |
| 2010/0141229 A1* | 6/2010 | Satou | H01L 23/5386 |
| | | | 323/282 |
| 2011/0058348 A1* | 3/2011 | Sakai | H01L 23/50 |
| | | | 361/803 |
| 2014/0084993 A1* | 3/2014 | Takao | H02M 7/003 |
| | | | 327/534 |
| 2016/0164417 A1* | 6/2016 | Ishii | H01L 25/00 |
| | | | 323/271 |
| 2018/0226383 A1 | 8/2018 | Yamaguchi | |

FOREIGN PATENT DOCUMENTS

| | | |
|---|---|---|
| JP | 2014-067760 A | 4/2014 |
| JP | 2015-226438 A | 12/2015 |
| WO | 2017/047345 A | 3/2017 |

\* cited by examiner

F I G . 1
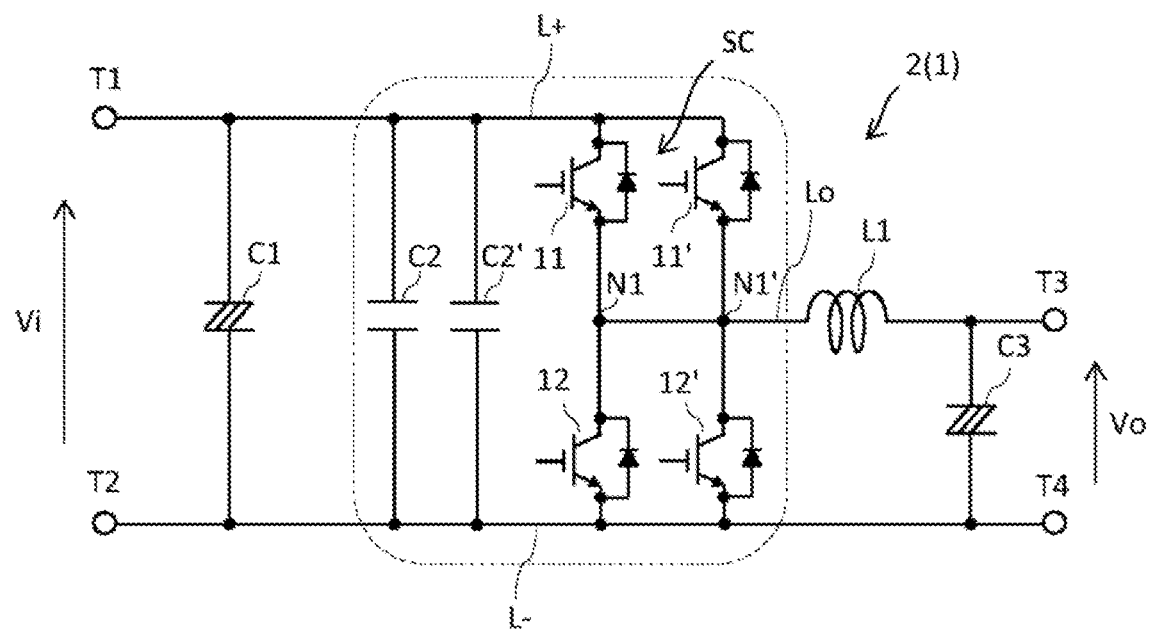

ELECTRONIC CIRCUIT DEVICE

CROSS-REFERENCE TO RELATED APPLICATIONS

This application is the national phase under 35 U. S. C. § 371 of PCT International Application No. PCT/JP2018/019433 which has an International filing date of May 21, 2018 and designated the United States of America.

FIELD

The present disclosure relates to an electronic circuit device.

This application claims priority on Japanese Patent Application No. 2017-121608 filed on Jun. 21, 2017, the entire contents of which are hereby incorporated.

BACKGROUND

Japanese Patent Application Laid-Open No. 2003-164040 discloses a circuit structure that can efficiently cool bus bars constituting a power circuit with a simple structure. The circuit structure is provided with a plurality of bus bars constituting a power circuit, and a heat radiation member for cooling the bus bars, and the heat radiation member has a bus bar bonding surface coated with an insulating layer. Each bus bar is directly bonded with the bus bar bonding surface in a state where the plurality of bus bars are aligned on the bus bar bonding surface. A power conversion circuit such as a DC regulator is incorporated into the circuit structure, and the circuit structure is applied to an on-vehicle electrical connection box or the like.

Japanese Patent Application Laid-Open No. 2013-99057 discloses an electronic device, which is a power conversion device (DCDC convertor) configured to perform power conversion from a high-voltage storage battery to a low-voltage storage battery or power conversion from a low-voltage storage battery to a high-voltage storage battery, and in which a filter circuit such as an input filter circuit is connected with an input side of the power conversion circuit and a filter circuit such as an output filter circuit is connected with an output side of the power conversion circuit in order to reduce noise to enter electronic equipment or the like disposed outside the power conversion device.

The electronic device is provided with: filter means having a filter capacitor; first wiring configured to connect an external terminal and the filter means; and second wiring that is connected with a housing at a position closer to the external terminal than the filter means and connects the housing and the filter means.

As a result, it is possible to reduce the parasitic inductance or electromagnetic induction effect and ensure a filter function.

SUMMARY

An aspect of the present disclosure is an electronic circuit device provided with: a power conversion circuit having a switching element incorporated therein; and a circuit substrate on which a circuit element constituting the power conversion circuit is mounted and a wiring pattern configured to electrically connect circuit elements is disposed, wherein the power conversion circuit is composed of a pair of switching elements configured to supply energy to a choke coil intermittently in phase, and the circuit substrate is constituted of a double-sided substrate in which one switching element is mounted on one main surface while the other switching element is mounted on the other main surface and a wiring pattern is provided in a manner such that a current path including one switching element and a current path including the other switching element overlap each other in a plane view and have opposite current directions.

The above and further objects and features will more fully be apparent from the following detailed description with accompanying drawings.

BRIEF DESCRIPTION OF THE DRAWINGS

FIG. 1 is a circuit diagram of an example of a power conversion circuit.

DETAILED DESCRIPTION

Technical Problems

Figure 2:
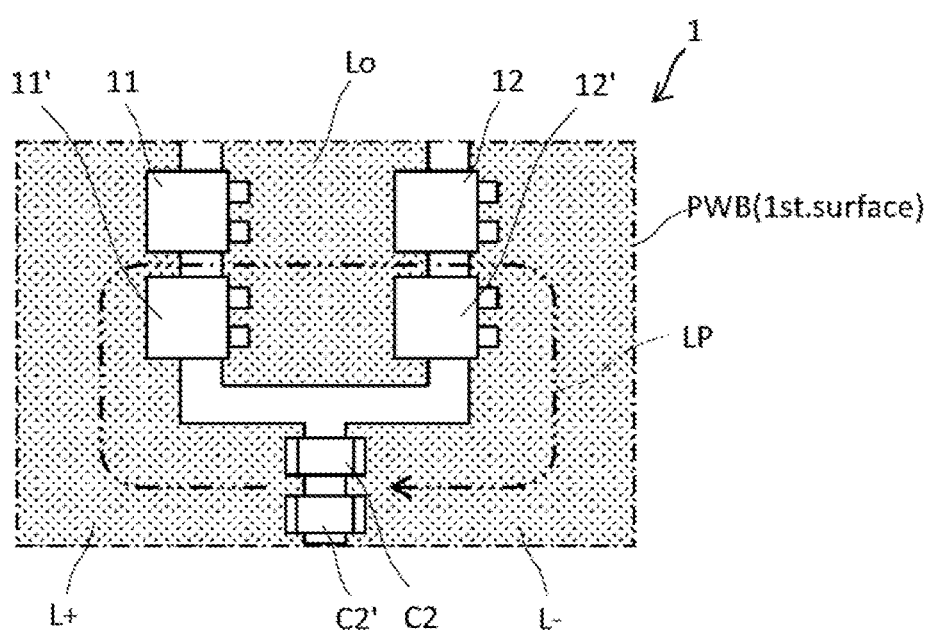
FIG. 2 is a plan view of a circuit substrate in which a main circuit element of a power conversion circuit is mounted only on one main surface.

A double-sided substrate or a multilayer substrate is used for a power conversion circuit such as a DC regulator disclosed in Patent Literature 1 or 2 with the aim of high density packaging. In such a substrate, circuit elements mounted on the respective layers are electrically connected with each other through a narrow wiring pattern or a via hole.

In such a circuit substrate, L, C, and R distributed constant circuits are three-dimensionally formed between a wiring pattern of a signal wire, and a wiring pattern of a ground wire, a part between wirings, a via hole, and a mounted circuit element, and parasitic capacity or parasitic inductance exists therein. It is to be noted that the value of parasitic inductance tends to be in inverse proportion to the wiring pattern width and in proportion to the wiring length.

When a semiconductor switching element incorporated in a power conversion device is influenced by parasitic inductance, large surge voltage may possibly be applied at the time of switching. It is therefore required to use a high voltage resistant semiconductor switching element, and this may heighten the on-resistance and increase the conduction loss, or lengthen the switching time and increase the power loss.

In a case where a power conversion circuit having a large current capacity is configured, a structure wherein a plurality of semiconductor switching elements are provided to share current is employed in order to reduce heat generation due to increase in current flowing through a semiconductor switching element. However, as current increases, influence of parasitic inductance becomes large correspondingly, and large serge voltage is generated.

The main object of the circuit structure disclosed in Patent Literature 1 is to put a plurality of bus bars constituting a power circuit into contact with a heat radiation member and cool the bus bars, and there is room for improvement in view of solving a harmful influence from parasitic inductance generated in the power circuit.

An object of the electronic device disclosed in Patent Literature 2 is to reduce influence of noise caused by parasitic inductance generated in wiring of the filter circuit. There is room for further improvement in view of reducing the influence of parasitic inductance generated in the power conversion device itself.

The present disclosure has been made in view of such problems, and an object of the present disclosure is to provide an electronic circuit device capable of reducing the influence of parasitic inductance as much as possible.

Embodiments of the Invention

First, contents of embodiments of the present disclosure will be listed and described. Moreover, at least a part of embodiments that will be described later may be combined arbitrarily.

(1) An electronic circuit device according to this embodiment is an electronic circuit device provided with: a power conversion circuit having a switching element incorporated therein; and a circuit substrate on which a circuit element constituting the power conversion circuit is mounted and a wiring pattern configured to electrically connect circuit elements is disposed, wherein the power conversion circuit is composed of a pair of switching elements configured to supply energy to a choke coil intermittently in phase, and the circuit substrate is constituted of a double-sided substrate in which one switching element is mounted on one main surface while the other switching element is mounted on the other main surface and a wiring pattern is provided in a manner such that a current path including one switching element and a current path including the other switching element overlap each other in plan view and have opposite current directions.

Since a wiring pattern is provided in a manner such that a current path including one switching element and a current path including the other switching element overlap each other in plan view and have opposite current directions, influences of inductance parasitic on wiring or the like cancel each other out. As a result, serge voltage applied to a switching element at the time of switching is effectively reduced.

(2) Preferably, the power conversion circuit is provided with: a pair of series circuit each having a high-voltage-side switching element and a low-voltage-side switching element connected in series; and a pair of capacitors respectively connected in parallel with the respective series circuits, and the circuit substrate is constituted of a double-sided substrate in which one series circuit and one capacitor are mounted on one main surface while the other series circuit and the other capacitor are mounted on the other main surface and a wiring pattern is provided in a manner such that a current path configured to connect one series circuit with one capacitor and a current path flowing through the other series circuit and the other capacitor overlap each other in plan view and have opposite current directions.

Since a wiring pattern is provided in a manner such that a current path configured to connect one series circuit with one capacitor and a current path flowing through the other series circuit and the other capacitor overlap each other in plan view and have opposite current directions, influences of parasitic inductance cancel each other out. As a result, serge voltage applied to a switching element at the time of switching is effectively reduced.

(3) Preferably, a wiring pattern is provided in the electronic circuit device in a manner such that the wiring pattern on both front and rear surfaces of the circuit substrate is made conductive through a via hole and a current path configured to connect one series circuit with the other capacitor and a current path configured to connect the other series circuit with one capacitor overlap each other in side view and have opposite current directions, so that influences of parasitic inductance cancel each other out as described above.

(4) Preferably, the electronic conversion circuit is a synchronous rectification step-down regulator. Although a synchronous rectification step-down regulator has an advantage that it is possible to reduce the power loss greatly in comparison with a non-synchronous rectification step-down regulator, a large value of parasitic inductance may possibly cause generation of a switching loss, make it difficult to ensure deadtime, or cause application of large surge voltage to a high-voltage-side switching element, which may cause damage.

Even in such a case, influences of parasitic inductance effectively cancel each other out, the switching loss is reduced, deadtime can be easily ensured, and a low pressure resistant switching element having a small on-resistance and a small conduction loss can be used when a wiring pattern is provided in a manner such that a closed circuit configured to connect one series circuit with one capacitor and a closed circuit flowing through the other series circuit and the other capacitor overlap each other and have different current directions.

It is to be noted that "current paths overlap each other" in this embodiment does not require overlap with physically and completely equal shapes but allows some difference in shapes or positions of the current paths. That is, it is only required that currents flowing in opposite directions along the current paths make it possible to cancel influences of inductance out and reduce serge voltage to an expected value. For example, when patterns formed on the front and rear surfaces of the substrate are physically equal and positional deviation occurs between the patterns on the front and rear surfaces, an allowable degree of deviation in front and rear wiring is not defined uniquely but decided by the pressure resistance of a used switching element. When defining the ratio of the area of a part, which does not overlap, of front and rear patterns as a deviation quantity of wiring, an allowable deviation quantity is as small as several per cents or less in a case where the pressure resistance of a switching element is low, or a deviation of approximately several tens per cents or even a deviation of approximately 50% is sometimes allowed in a case where the pressure resistance of a switching element is high.

DESCRIPTION OF EMBODIMENTS

Now, embodiments of the present invention will be described more specifically. It is to be noted that the present invention is intended not to be limited to the illustrations but to be described by the appended claims and include meanings equivalent to the claims and all modifications within the scope.

FIG. 1 illustrates a circuit diagram of a synchronous rectification step-down regulator that is an example of a power conversion circuit 2 to be incorporated in an on-vehicle electronic circuit device 1.

The synchronous rectification step-down regulator is a non-isolated synchronous rectification step-down regulator (which will be hereinafter referred to simply as a "step-down regulator") to be used for decreasing the output voltage of a storage battery having a high voltage of DC 48 V such as a lithium ion battery to a low voltage of DC 12 V and supplying power to various on-vehicle auxiliary devices, or charging a low-voltage storage battery such as a lead storage battery.

The step-down regulator is composed of an electrolytic capacitor C1 for stabilizing voltage that is connected between input terminals T1 and T2; a pair of bypass capacitors C2 and C2' connected in parallel with the electrolytic capacitor C1; a switching circuit SC connected in parallel with the capacitors C1, C2, and C2'; a choke coil L1; and a smoothing capacitor C3.

The switching circuit SC is provided with: a first series circuit in which a high-voltage-side switching element 11 and a low-voltage-side switching element 12 are connected at a node N1; and a second series circuit in which a high-switching element 11' and a low-voltage-side switching element 12' are connected at a node N1'. The high-voltage-side switching elements 11 and 11' are connected in parallel, and the low-voltage-side switching elements 12 and 12' are connected in parallel.

The choke coil L1 is connected between an output terminal T3 and the respective nodes N1 and N1' of the first series circuit and the second series circuit, and the smoothing capacitor C3 is connected between output terminals T3 and T4. A MOS-FET or an IGBT is preferably used as a switching element.

An input DC voltage Vi applied across the input terminals T1 and T2 is decreased by the step-down regulator, and an output DC voltage $V_O$ is outputted from the output terminals T3 and T4. It is to be noted that the symbol L+ denotes a positive power supply line, the symbol L− denotes a negative power supply line (ground line), and the symbol $L_O$ denotes an output line of the switching circuit SC.

Since a pair of series circuits of the first series circuit and the second series circuit are provided as the switching circuit SC, current is shared by a pair of switching elements 11 and 11' or a pair of switching elements 12 and 12' even when a step-down regulator having a large current capacity is required, and excessive power generation is not caused in comparison with a case where the switching circuit is constituted of a single series circuit.

Regarding the high-voltage-side switching elements 11 and 11' and the low-voltage-side switching elements 12 and 12', the gate voltage is controlled to be alternately turned on synchronously with a constant deadtime, when both are turned off, therebetween. When the high-voltage-side switching elements 11 and 11' are turned on, the smoothing capacitor C3 is charged from the input terminal T1 through the high-voltage-side switching elements 11 and 11' and the choke coil L1. At this time, energy is charged in the choke coil L1.

Then, when the high-voltage-side switching elements 11 and 11' are turned off and the low-voltage-side switching elements 12 and 12' are turned on with a deadtime therebetween, energy charged in the choke coil L1 is released along a closed loop including the low-voltage-side switching elements 12 and 12', and the smoothing capacitor C3 is charged.

A desired DC voltage $V_O$ is outputted between the output terminals T3 and T4 by adjusting the switching cycle of the high-voltage-side switching elements 11 and 11' and the low-voltage-side switching elements 12 and 12'. Although not illustrated, the step-down regulator is further provided with a control circuit configured to monitor the voltage between the output terminals T3 and T4 and control the gate voltage of the high-voltage-side switching elements 11 and 11' and the low-voltage-side switching elements 12 and 12'.

FIG. 2 illustrates a general circuit substrate PWB in which a main circuit element in the region surrounded by the broken line of the step-down regulator illustrated in FIG. 1 is mounted only on one main surface.

A cupper pattern constituting the positive power supply line L+, the negative power supply line L−, and the output line $L_O$ of the switching circuit SC is disposed on one main surface of the circuit substrate PWB. It is to be noted that epoxy resin, phenol resin, or the like is arbitrarily used as a base material constituting the circuit substrate PWB, and especially glass epoxy resin or the like is used in a case where it is required to ensure heat resistance.

The high-voltage-side switching elements 11 and 11' are mounted between the positive power supply line L+ and the output line $L_O$, the low-voltage-side switching elements 12 and 12' are mounted between the negative power supply line L− and the output line $L_O$, and the capacitors C2 and C2' are mounted between the positive power supply line L+ and the negative power supply line L−.

The arrow denoted at the symbol LP in FIG. 2 indicates a virtual current path LP, which flows through the capacitors C2 and C2' and the switching circuit SC and is obtained by synthesizing a current path flowing from L+ through the high-voltage-side switching elements 11 and 11' to the output line $L_O$ while the high-voltage-side switching elements 11 and 11' are ON and a current path flowing from the low-voltage-side switching elements 12 and 12' through the output line $L_O$, an unillustrated choke coil L1, and the smoothing capacitor C3 to L− while the low-voltage-side switching elements 12 and 12' are ON.

Figure 3:
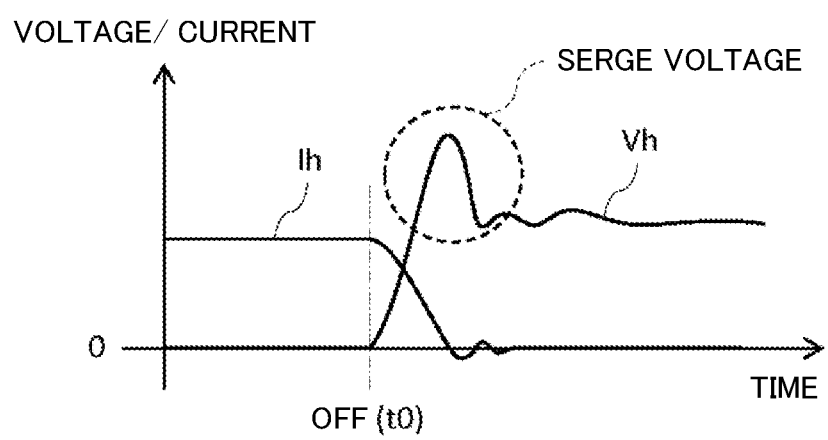
FIG. 3 is an explanatory view of a switching waveform of a high-voltage-side switching element in a case where influence of parasitic inductance is large.

FIG. 3 illustrates a voltage waveform Vh and a current waveform Ih at both ends of the high-voltage-side switching elements 11 and 11' in a case where a general circuit substrate PWB illustrated in FIG. 2 is constructed. It is confirmed that large serge voltage is applied to drains of the high-voltage-side switching elements 11 and 11', and the drain current has a gentle fall when the high-voltage-side switching elements 11 and 11' are shifted from ON state to OFF state at a time $t_0$.

Counter electromotive force, which is generated when the high-voltage-side switching elements 11 and 11' are turned off in a state where large current is flowing along a part of the current path LP illustrated in FIG. 2 and is expressed as V=−L·di/dt, becomes one cause of serge voltage generation. Since the value of serge voltage becomes larger as the value of parasitic inductance L of a circuit is larger, and becomes larger as the time variation of the current value is larger, larger serge voltage is generated as a step-down regulator has a larger value of parasitic inductance L and a larger current capacity.

Since it is required to employ a high-priced switching element having a high voltage resistance as each of the high-voltage-side switching elements 11 and 11' in order to prevent the element from being damaged by such large serge voltage, and current that flows when the high-voltage-side switching elements 11 and 11' are shifted from ON state to OFF state leads to power generation loss, the advantage that the power loss is smaller than a non-synchronous rectification step-down regulator using a diode instead of a low-voltage-side switching element is lost.

Figure 4A:
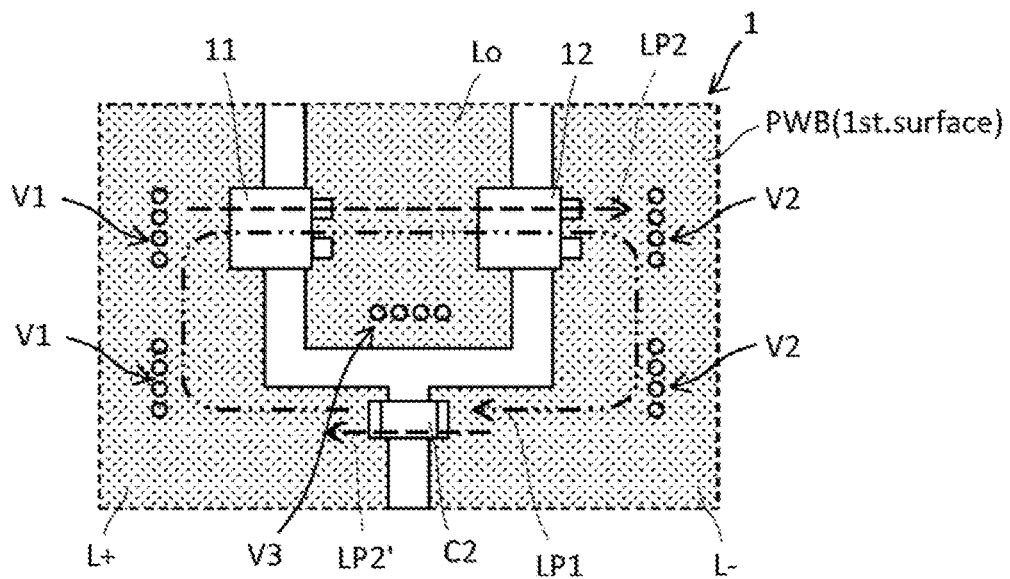
FIG. 4A is a plan view of one main surface of a circuit substrate on which a part of a main circuit element of a power conversion circuit is mounted.
Figure 4B:
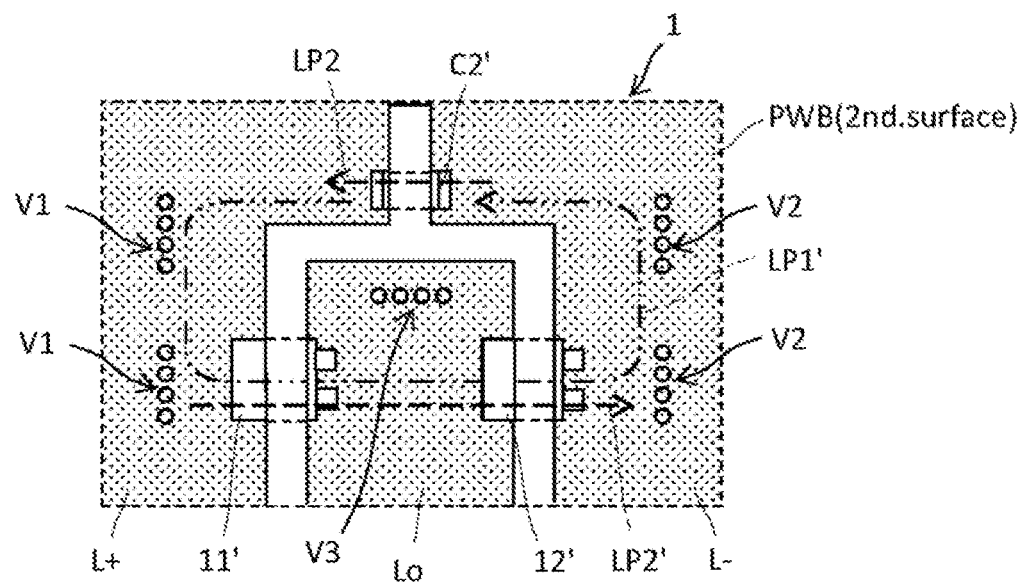
FIG. 4B is a plan view of the other main surface of the circuit substrate on which a part of a main circuit element of a power conversion circuit is mounted.

In the electronic circuit device 1 according to the present disclosure, the switching elements 11 and 12 constituting the first series circuit and one capacitor C2 are mounted on one main surface (first surface) of the double-sided circuit substrate PWB (see FIG. 4A) while the switching elements 11' and 12' constituting the second series circuit and the other capacitor C2' are mounted on the other main surface (second surface) (see FIG. 4B) as illustrated in FIGS. 4A and 4B. It is to be understood that the first series circuit and the second series circuit may be mounted on any of the main surfaces.

The symbols V1, V2, and V3 in the figures denote via holes (through holes) for electrically connecting a wiring pattern on the first surface and a wiring pattern on the second surface. Copper patterns that function as the negative power supply line L+ on both surfaces are electrically connected with each other through the via hole V1, copper patterns that function as the negative power supply line L− on both surfaces are electrically connected with each other through the via hole V2, and copper patterns that function as the output line $L_0$ on both surfaces are electrically connected with each other through the via hole V3.

The respective wiring patterns L+, L−, and $L_0$ are formed in a manner such that the current path LP1 (see FIG. 4A) configured to connect one capacitor with the first series circuit mounted on one main surface (first surface) and the current path LP1' (see FIG. 4B) flowing through the other capacitor and the other series circuit mounted on the other main surface (second surface) overlap each other in plan view and have opposite current directions.

Moreover, the wiring patters L+, L−, and $L_0$ are formed in a manner such that the current path LP2 flowing through the first series circuit mounted on one main surface (first surface) and the other capacitor mounted on the other main surface (second surface) and the current path LP2' configured to connect the other series circuit mounted on the other main surface (second surface) with one capacitor mounted on one main surface (first surface) overlap each other in side view (view direction along a surface of the substrate) and have opposite current direction.

Figure 4C:
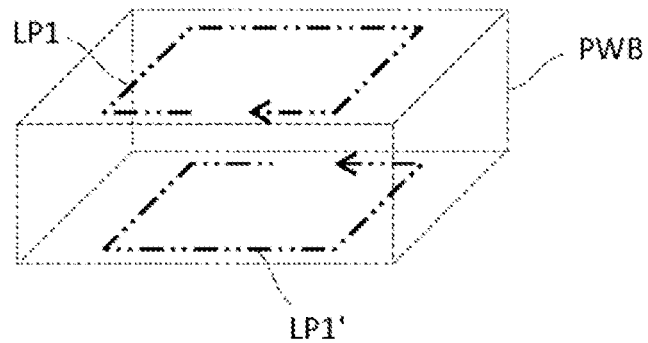
FIG. 4C is an explanatory view of current paths formed on the respective main surfaces.

FIG. 4C illustrates the current path LP1 formed on one main surface (first surface), and the current path LP1' formed on the other main surface (second surface). Since the current paths LP1 and LP1' have opposite current directions, counter electromotive forces that are generated when the high-voltage-side switching elements 11 and 11' are turned off and are expressed as V=−L·di/dt function to cancel each other out.

Figure 4D:
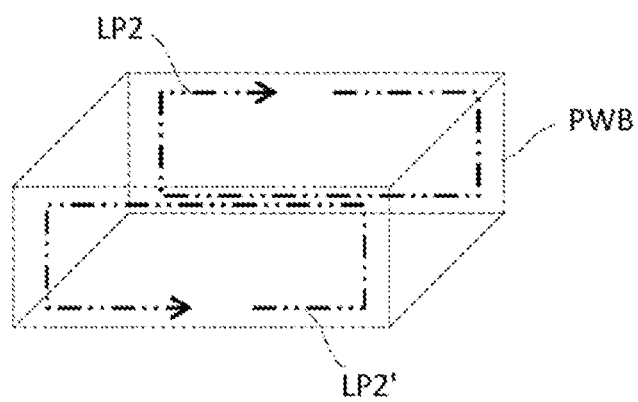
FIG. 4D is an explanatory view of current paths formed across both front and rear main surfaces.

FIG. 4D illustrates the current paths LP2 and LP2' formed to cross from one main surface (first surface) of the circuit substrate PWB to the other main surface (second surface) in the thickness direction. In such a case, since the closed circuits LP2 and LP2' also have opposite current directions, counter electromotive forces that are generated when the high-voltage-side switching elements 11 and 11' are turned off and are expressed as V=−L·di/dt function to cancel each other out.

Figure 5:
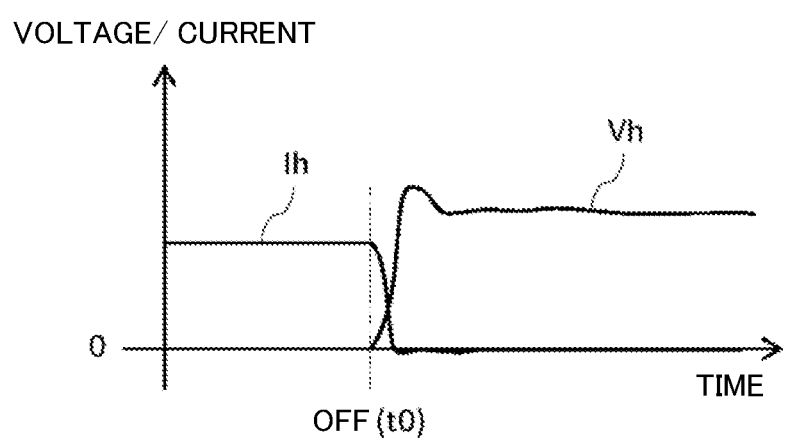
FIG. 5 is an explanatory view of a switching waveform of a high-voltage-side switching element in a case where influence of parasitic inductance is reduced.

FIG. 5 illustrates a voltage waveform Vh and a current waveform Ih at both ends of the high-voltage-side switching elements 11 and 11' incorporated in the electronic circuit device 1 explained with reference to FIGS. 4A and 4B. It is confirmed that serge voltage applied to drains of the high-voltage-side switching elements 11 and 11' lowers, and the drain current has a steep fall when the high-voltage-side switching elements 11 and 11' are shifted from ON state to OFF state at a time $t_0$. That is, serge voltage to be generated when the high-voltage-side switching elements 11 and 11' are turned off is effectively reduced as a result of cancelling out of influence of parasitic inductance.

Although FIGS. 4A and 4B illustrate only the mount state of a pair of capacitors C2 and C2' and the switching elements 11, 11', 12, and 12' constituting the first series circuit and the second series circuit on the circuit substrate PWB, it is to be understood that other circuit elements C1, L1, and C3 illustrated in FIG. 1, a voltage detection circuit configured to monitor a voltage $V_0$ between the output terminals T3 and T4, a control circuit configured to control gate voltages of the high-voltage-side switching elements 11 and 11' and of the low-voltage-side switching elements 12 and 12', a driver circuit configured to drive the switching elements 11, 11', 12, and 12', or the like may be further mounted.

The following description will explain another embodiment.

Although the above embodiment has explained a case where the power conversion circuit is a synchronous rectification step-down regulator, it is only required that a power conversion circuit to which the present invention can be applied is composed of a pair of switching elements configured to supply energy to at least a choke coil intermittently in phase, the circuit substrate is constituted of a double-side substrate in which one switching element is mounted on one main surface while the other switching element is mounted on the other main surface, and a wiring pattern is provided in a manner such that a current path including one switching element and a current path including the other switching element overlap each other in plan view and have opposite current directions.

Accordingly, the present invention can be applied not necessarily to a non-isolated synchronous rectification step-down regulator but to a nonsynchronous rectification step-down regulator, a step-up regulator, or a step-up/down regulator, or to an isolated step-down regulator, an isolated step-up regulator, or an isolated step-up/down regulator.

Figure 6:
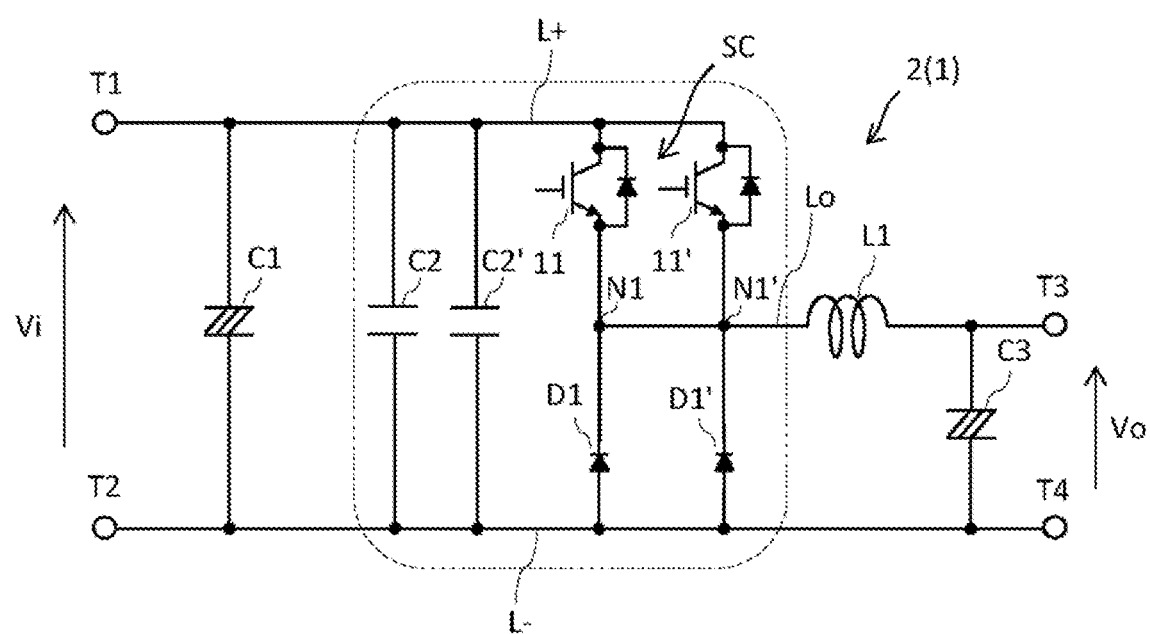
FIG. 6 is a circuit diagram of a non-synchronous rectification step-down regulator that is another example of a power conversion circuit.

FIG. 6 illustrates a nonsynchronous rectification step-down regulator, in which diodes D1 and D1' are disposed instead of the low-voltage-side switching elements 12 and 12', as a power conversion circuit. When the diodes D1 and D1' are disposed instead of the low-voltage-side switching elements 12 and 12' illustrated in FIGS. 4A and 4B, a similar function can be realized.

Figure 7:
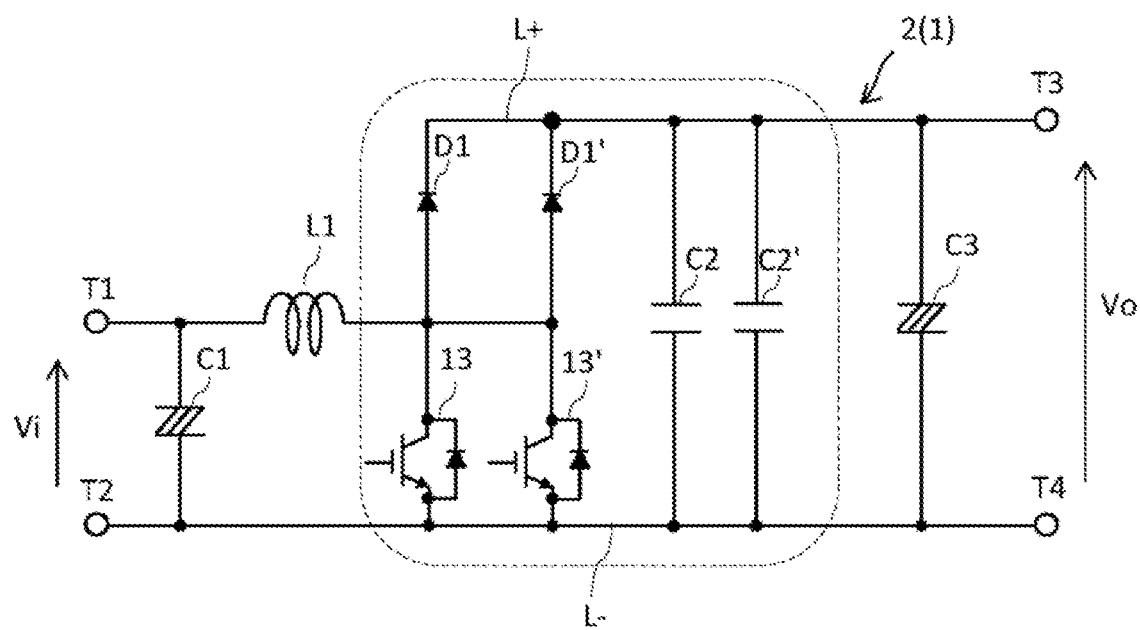
FIG. 7 is a circuit diagram of a step-up regulator that is another example of a power conversion circuit.

FIG. 7 illustrates a step-up regulator as a power conversion circuit. It is also required that this example is composed of a pair of switching elements 13 and 13' configured to supply energy to a choke coil L1 intermittently in phase, and the circuit substrate is constituted of a double-sided substrate in which one switching element 13 is mounted on one main surface while the other switching element 13' is mounted on the other main surface, and a wiring pattern is provided in a manner such that a current path including one switching element 13 and a capacitor C2 and a current path including the other switching element 13' and a capacitor C2' overlap each other in plan view and have opposite current directions. One choke coil L1 may be provided, or a pair of choke coils L1 may be provided.

The present invention can be applied to an arbitrary regulator circuit provided with a pair of switching elements to be turned on or off at least in phase in addition to a DC regulator and also can be widely adapted to a full bridge conversion circuit or a half bridge conversion circuit, for example.

It is to be understood that the embodiments described above are only examples of an electronic circuit device to which the present invention is applied, and the specific circuit configuration of the respective units and the wiring pattern configuration of the circuit substrate can be arbitrarily modified and designed within the scope with which the effects of the present invention are exhibited.

An electronic circuit device of the present disclosure can be applied to electronic circuit devices for various purposes that require reduction in influence of parasitic inductance.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. An electronic circuit device comprising a power conversion circuit and a circuit substrate,
   wherein the power conversion circuit has a pair of switching elements configured to supply energy to a choke coil intermittently in phase, and
   the circuit substrate is constituted of a double-sided substrate in which one switching element is mounted on a first surface while the other switching element is mounted on a second surface and a wiring pattern is provided in a manner such that a current path including the one switching element and a current path including the other switching element overlap each other in plan view and have opposite current directions.

2. The electronic circuit device according to claim 1, wherein the power conversion circuit comprises:
   a first series circuit having a high-voltage-side switching element and a low-voltage-side switching element connected in series and constituting the one switching element;
   a second series circuit having a high-voltage-side switching element and a low-voltage-side switching element connected in series and constituting the other switching element;
   a first capacitor connected in parallel with the first series circuit; and
   a second capacitor connected in parallel with the second series circuit, and
   the first series circuit and the first capacitor are mounted on the first surface while the second series circuit and the second capacitor are mounted on the second surface and the wiring pattern is provided in a manner such that a current path configured to connect the first series circuit with the first capacitor and a current path configured to connect the second series circuit with the second capacitor overlap each other in plan view and have opposite current directions.

3. The electronic circuit device according to claim 2, wherein the wiring pattern is provided in a manner such that the wiring pattern on both the first surface and the second surface of the circuit substrate is made conductive through a via hole and a current path configured to connect the first series circuit with the second capacitor and a current path configured to connect the second series circuit with the first capacitor overlap each other in side view and have opposite current directions.

4. The electronic circuit device according to claim 1, wherein the power conversion circuit is a synchronous rectification step-down regulator.

* * * * *